United States Patent [19]

Ogami et al.

[11] Patent Number: 4,457,419

[45] Date of Patent: Jul. 3, 1984

[54] CONVEYING/POSITIONING APPARATUS FOR SHEET MATERIAL

[75] Inventors: Nobutoshi Ogami, Hikone; Takeshi Takada, Shiga; Mikio Spoda, Omi-Hachiman; Yasuhiro Kurata, Hikone, all of Japan

[73] Assignee: Dainippon Screen Mgf., Co., Ltd., Kyoto, Japan

[21] Appl. No.: 359,780

[22] Filed: Mar. 19, 1982

[30] Foreign Application Priority Data

Apr. 3, 1981 [JP] Japan ................................ 56-50982

[51] Int. Cl.³ .......................................... B65G 47/22
[52] U.S. Cl. .................................... 198/345; 198/414
[58] Field of Search ............... 198/339, 341, 345, 346, 198/394, 414, 460

[56] References Cited

U.S. PATENT DOCUMENTS

| 2,897,948 | 8/1959 | Cranston | 198/414 X |
| 2,937,553 | 5/1960 | Sherman | 198/414 X |
| 3,442,410 | 5/1969 | Solomonson | 198/414 X |
| 4,040,512 | 8/1977 | Ness | 198/460 |
| 4,217,977 | 8/1980 | Tam | 198/345 X |
| 4,315,705 | 2/1982 | Flint | 198/339 X |

Primary Examiner—James L. Rowland
Attorney, Agent, or Firm—Brumbaugh, Graves, Donohue & Raymond

[57] ABSTRACT

A positioning assembly comprises a base having a pair of taller projections and a pair of shorter projections on its surface. The positioning assembly is placed between a pair of belts which form a conveying assembly, so that the taller projections receive a sheet material which is conveyed along the belts. The positioning assembly is positioned at a middle position in which the taller projections project above the belts, whereby the taller projections receive the material. Receiving the material, the positioning assembly is elevated to a high position where all the projections including the shorter one project above the belts, whereby the material is held on the base. The material is processed with being rotated at the high position. Then the positioning assembly is lowered to a low position where all the projections are below the belts, whereby the material is delivered again onto the belts to be conveyed to the next process.

11 Claims, 3 Drawing Figures

CONVEYING/POSITIONING APPARATUS FOR SHEET MATERIAL

BACKGROUND OF THE INVENTION

The present invention relates to an apparatus for conveying and positioning circular sheet materials, the apparatus being incorporated in a processing apparatus.

An apparatus of this kind has been well known, for example, in case that the material to be processed is a substrate for integrated circuits, i.e. silicon wafer, the wafer which is round or at least approximately circular is to a predetermined position of a processing apparatus, where it is held, or while being rotated, to be subjected to required processings. Such apparatus is so-called vacuum suction type, which enables the wafer to be held by vacuum suction and to be rotated at about several 100 rpm. However, in this kind of apparatus, there have been such disadvantages as follows. That is, first, a conventional apparatus would require the complexity of its construction, because a supporting shaft which supports a base on which a wafer is held and rotates it together with the wafer set thereon is also functioned as a suction pipe for holding the wafer by vacuum suction therethrough. Second, when a processing solution is sprayed onto the wafer, the processing solution supplied on the wafer surface, which has in general corroding functions, would be apt to flow into the suction pipe which corresponds to the supporting shaft, or up to a vaccum pump, whereby the processing apparatus itself tends to be subjected to damages, because of its inherent construction as mentioned in the first disadvantage.

SUMMARY OF THE INVENTION

In view of the above disadvantages, the present invention tends to solve the disadvantages inherent in conventional apparatus.

Accordingly, it is an object of the present invention to provide a conveying and positioning apparatus having a mechanically simple construction which is utterly novel without using any vacuum suction means.

It is another object of the present invention to provide a conveying and positioning apparatus which enables a precise positioning of materials to be processed with simple mechanical arrangements.

It is another object of the present invention to provide a conveying and positioning apparatus which enables a speedy positioning of materials to be processed immediately after conveyance.

Other features and advantages of the invention will be apparent from the following description taken in connection with the accompanying drawings wherein:

FIG. 1 shows a diagrammatical perspective view of an embodiment of an apparatus according to the present invention, FIG. 2 shows a sectional view of a part of the embodiment shown in FIG. 1, FIG. 3 shows a diagrammmatical plan view of the material to be processed in conveyance supported by the apparatus according to the invention.

DETAILED DESCRIPTION OF THE INVENTION

Figure 1:
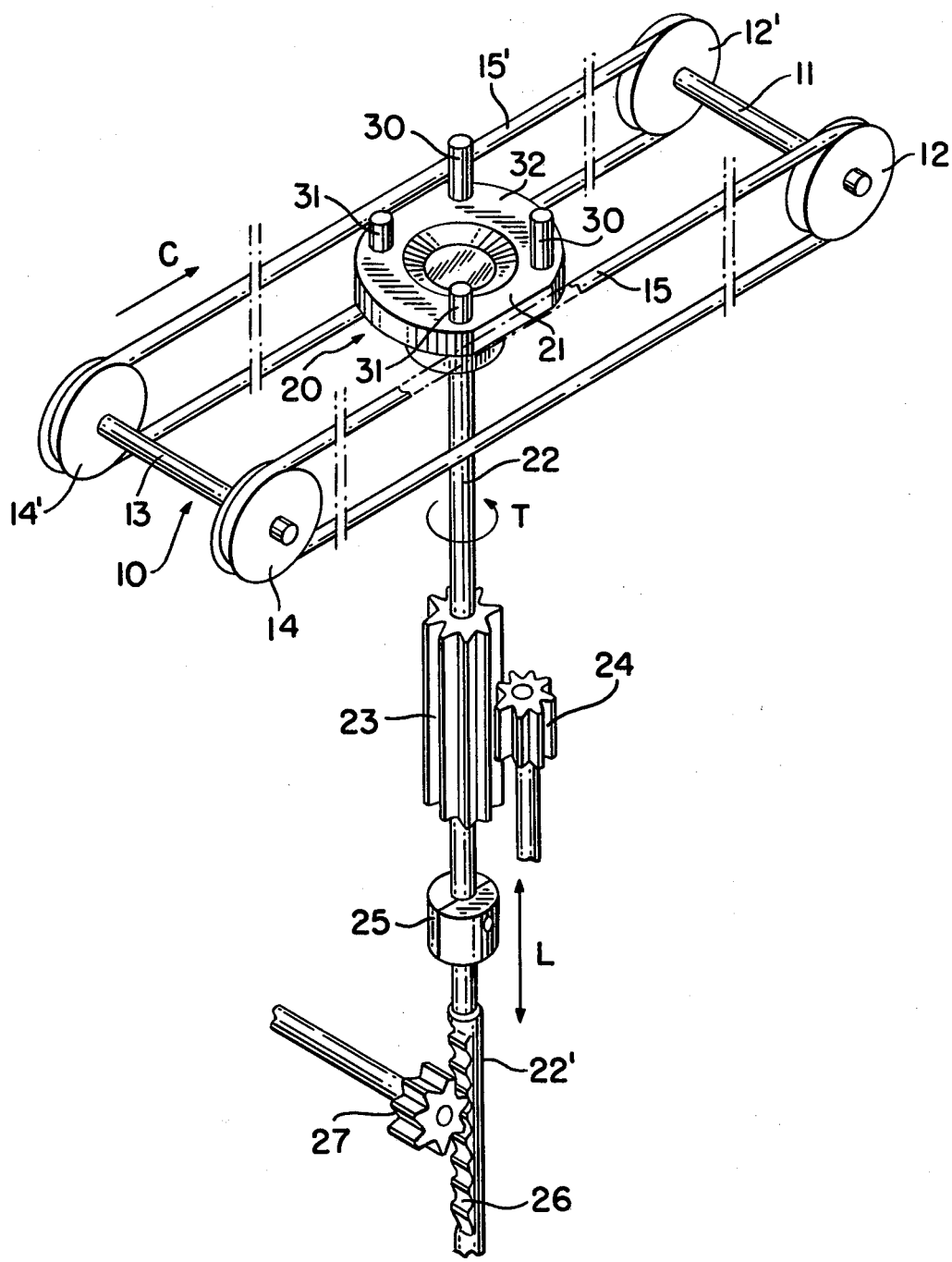

Referring to FIG. 1, a conveying assembly 10 includes a pair of driving pulleys 12,12' which are connected by an axle 11 each other, a pair of driven pulleys 14,14' which are also connected each other by an axle 13, and a pair of conveying belts 15,15' which are respectively stretched between the same side pulleys 12,12' and 14,14', the belts 15,15' respectively conducting the driving forces of the driving pulleys 12,12' to the driven pulleys 14,14'. The width between the respective pulleys 12,12' and 14,14' is shorter than the diameter of a wafer which is to be placed on the base 21, and the belts 15,15' extending in parallel to each other. The belts 15,15' are respectively arranged to drive only in a forward direction, or to drive in both directions, forward and reverse. Such arrangements enable the respective belts 15,15' to drive circularly. A positioning assembly 20 includes a supporting base 21 on which a sheet material, for example a wafer M, is placed, a supporting shaft 22 which is connected to the base at the top end thereof and supports it, a wide-width gear 23 which is fixed to the supporting shaft 22, a pinion 24 engaged with the gear 23, a rod 22' which is connected to the shaft 22 by a coupling 25 and which extends below, a rack 26 provided on the rod 22', and a pinion 27 engaged with the rack 26, by which the positioning assembly 20 can be elevated or lowered. The supporting base 21 has a smaller width than that between the belts 15 and 15', and has, in the conveying direction G, a greater diameter than that of the wafer M. On the surface of the base 21 there is provided a circular dent and a shoulder 32 which is formed around the dent. The surface of the shoulder 32 is adequately roughened to hold the wafer thereon. On the surface of the base 21, two kinds of projections 30,31, one taller and the other shorter, are aligned along a circumference which is greater than the wafer M in diameter, and smaller than space between the belts. Respective kinds of the projections are opposite to each other along the belts, so as to receive the wafer M by the projections 30,31. The center of the circumpherence on which the projections 30,31 are aligned is selected at the middlepoint between the belts. The taller projection 30 comprises at least two projections, and the shorter 31 at least one, to receive the wafer M on the base. It is desirable to place the two taller projections 30 respectively as close to each belt as possible yet with approximately equal spacing to the belts, and also to place the lower projections 31, if there are more than one, respectively approximately opposite to the taller projections across the center of the base. In case there are more than two of or both of the above two kinds of projections, the third one may be placed adequately between the two but should be slightly outside the outer circumference of the wafer. Or, in case the lower projection 31 is only one, the distance between the taller projection 30 and the lower one 31 should be shorter than the diameter of the wafer yet the location should be slightly outside the outer circumference of the wafer. Moreover, it is desirable to round off or taper the top of the lower projections for easier insertion of the wafer between the taller and lower projections.

Figure 2:
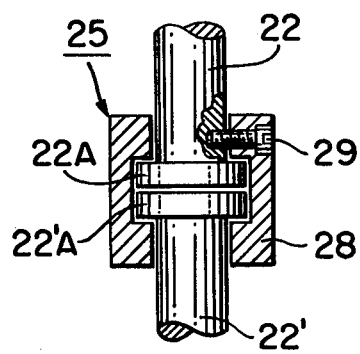

As shown in FIG. 2, the coupling 25 includes a housing 28 which has an inner flange adaptable to receive heads 22A, 22'A of the shaft 22 and rod 22', the respective heads being bigger than the shaft and rod in diameter. The housing 28 is fixed in close by a screw 29, whereby both the shaft 22 and the rod 22' have a common axis and the shaft 22 can rotate freely independent of the rod 22', by receiving the rotation of the pinion 24. And the engagement of the rack 26 and pinion 27 enables the rod 22' to ascend and descend in the perpendicular direction L, thus the shaft 22 can ascend and descend dependent on the movement of the rod 22' as well as the rotation in the direction T, during these operations the gear 23 and pinion 24 are at all times engaged by means of the wide-width of the gear.

Figure 3:
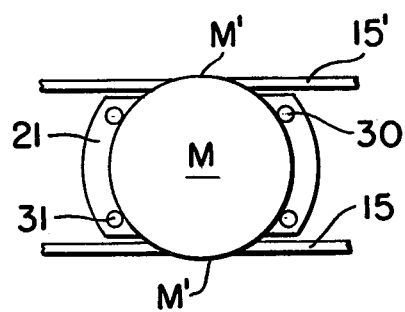

Referring again to FIG. 1, when the conveying assembly 10 is driven forward only, the positioning assembly 20 is designed to change its height in three stages, that is, "high", "middle" and "low". While the wafer M is conveyed with being held at its peripheral edges M', on the belts 15, 15' (as shown FIG. 3), from the inlet side of the conveying assembly 10 to the precise above the positioning assembly 20, the height of the positioning assembly 20 is selected at the "middle" position, whereby only the taller projections 30 are projected above the belts 15,15', thus the taller projections 30 function as a stopper of the wafer's conveyance. As soon as the wafer contacts with the taller projections 30, which is detected by a detector (not shown), the base 21 is raised to the "high" position, whereby the lower projections 31 also projected above the belts 15,15' by means of the elevation of the positioning assembly 20 itself, and thus the wafer M is surrounded by all the projections. Even if the wafer is some what deflected sidewise during the conveyance, the wafer is automatically positioned by means of the contact with the taller projections 30. The periphery of the wafer is exactly positioned in the circumference formed by the projections, and the wafer is held on the base above the belts. And the wafer is rotated with keeping the "high" position, then processing solution is supplied or sprayed onto the wafer's surface.

After the processing in such a manner as mentioned above, the positioning assembly 20 is lowered to the "low" position, where all the projections are lowered below the belts with remaining the wafer thereon. Thus, the wafer is conveyed again, being held on the belts, to the outlet end of the conveying assembly. Then, the positioning assembly 20 is reset at the "middle" position to complete one cycle of the process, which is repeated further in the same manner.

In case the conveying assembly 10 is designed to be driven in both forward and backward directions, only two stages of "high" and "middle" position are required to control the base height of the position of the positioning assembly. In this case, one cycle completes in the order of: forward driving of the balts 15,15'; elevation of the positioning assembly 20; processing (for example spraying developing solution), during which the base 21 is rotated; lowering the positioning assembly 20; and inverse driving of the belts, in such a manner one operation cycle is made and then repeated.

To control the various operations as mentioned above, electronic circuit for micro-computers or electrical circuit for sequence control circuits can be applied, as well as such detectors as micro switches and photoelectric tubes.

As clarified above, the apparatus according to the present invention enables exact and easy positioning of circular sheet materials such as wafers, as the centering of the material to be processed is automatically made at the time when it is conveyed from the conveying assembly to the positioning assembly. Particularly, no vaccum suction is required even when the material is turned at the specified position. Not only the work efficiency is improved by easy automatic operation, the equipment is also quite suitable for continuous processing of circular materials in corrosive or injurious atmosphere.

What is claimed is:
1. An apparatus for conveying and positioning a circular sheet material to be processed comprising
a conveying assembly including at least two pairs of pulleys, each of the respective pairs of pulleys being connected by an axle; and a pair of belts, the belts being stretched in parallel between the pulleys on the same side of said axles, the spacing between said belts being selected so as to hold the material at its peripheral edge, the material being conveyed on the belts as they move, and
a positioning assembly including a base having projections on the surface thereof adaptable to hold the material at a predetermined position, the material being received on said base and among said projections; a rotatable shaft fixed to said base at the top of the shaft and having rotation means for rotation of said base; and an elevation rod connected to the other end of said shaft through coupling means which enables said shaft and rod to be independently operated, said rod having elevation means for raising and lowering the positioning assembly to predetermined positions, said base being raised and lowered by means of said elevation means and also being rotated by means of said rotation means, said base located between the two pairs of pulleys and between the belts wherein the projections provided on the base surface comprise two kinds of projections, one being taller and the other shorter, said projections being positioned on a circumference slightly greater in diameter than the material so as to hold the material at the peripheral edge thereof by means of said projections.

2. An apparatus according to claim 1, wherein the width of the base is shorter than the spacing between the belts, whereby the base may be freely raised between them.

3. An apparatus according to claim 2, wherein the base is long enough in the conveying directin so as to be longer than the diameter of the material.

4. An apparatus according to claim 1, including at least two taller projections mounted on a conveying-direction-side of the base and being projected above the belts when the conveying material is received by the positioning assembly.

5. An apparatus according to claim 4, wherein the taller projections are designed to be lowered below the belts when the material is returned from the base onto the belts.

6. An apparatus according to claim 1, wherein at least one shorter projection is mounted on the opposite side from the taller projections, the shorter projection being below the belts when the material is received from the conveying assembly by the positioning assembly, and being projected above the belts when the material is supported on the base.

7. An apparatus according to claim 1, wherein the rotation means for rotating the shaft comprises a wide-width gear fixed to the shaft having a common axis therewith and a driving pinion, said gear having enough width to be engaged with said pinion at all times, whereby the positioning assembly may be rotated independent of the height thereof.

8. An apparatus according to claim 1, wherein the coupling means for connecting the shaft and rod comprises a pair of flanges respectively formed at the end of the shaft and rod, said flanges facing each other at their ends; and a housing which receives said flanges therein and is fixed to either the shaft or the rod by means of a screw, whereby the shaft is rotated independently of the rod.

9. An apparatus according to claim 1, wherein the elevating means for raising and lowering the positioning assembly comprises a rack provided on the rod, said rack extending in a perpendicular direction along the rod; and a driving pinion engaged with said rack, whereby the positioning assembly may be positioned at predetermined heights.

10. An apparatus according to claim 9, wherein the engagement of the rack and pinion enables the positioning assembly to be elevated to predetermined positions.

11. An apparatus according to claim 7, wherein the axis of the shaft is common to the rod, the base being rotated by means of the engagement of the wide-width gear and pinion, and also being elevated by means of the engagement of a rack and pinion, both the rotation and elevation of the base being carried out independently.

* * * * *